United States Patent
Shirley

(10) Patent No.: US 6,205,066 B1
(45) Date of Patent: Mar. 20, 2001

(54) DRAM ARRAY WITH GRIDDED SENSE AMPLIFIER POWER SOURCE FOR ENHANCED COLUMN REPAIR

(75) Inventor: Brian Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/502,822

(22) Filed: Feb. 11, 2000

Related U.S. Application Data

(63) Continuation of application No. 09/205,188, filed on Dec. 19, 1998, now Pat. No. 6,111,797.

(51) Int. Cl.[7] .................................................. G11C 7/00
(52) U.S. Cl. .................... 365/200; 365/189.05; 365/196; 365/225.7; 365/226
(58) Field of Search .................................. 365/200, 226, 365/225.7, 189.05, 196

(56) References Cited

U.S. PATENT DOCUMENTS

| | | |
|---|---|---|
| 5,042,011 | 8/1991 | Casper et al. . |
| 5,280,205 | 1/1994 | Green et al. . |
| 5,627,785 | 5/1997 | Gilliam et al. . |
| 5,742,549 * | 4/1998 | Ochoa et al. .......................... 365/205 |
| 5,796,664 * | 8/1998 | Tsuruda et al. ....................... 365/200 |
| 5,986,956 * | 11/1999 | You ........................................ 365/200 |

* cited by examiner

*Primary Examiner*—Richard Elms
*Assistant Examiner*—VanThu Nguyen
(74) *Attorney, Agent, or Firm*—Dickstein Shapiro Morin & Oshinsky LLP

(57) ABSTRACT

An apparatus for the supply of power to a gridded array of sense amplifier circuits contained within a memory, e.g., a DRAM, is provided. When the column sensed is operating normally the power source supplies a first voltage to the sense amplifier circuits so that they properly latch the state of an addressed memory cell. When a column has been repaired out the apparatus is capable of driving the sense amplifier circuits with a second voltage so that they are prevented from latching the state of an addressed memory cell, thus avoiding the problems attributable to short circuits between bit and word lines and between the cell plate and bit lines of a memory cell array.

20 Claims, 9 Drawing Sheets

DRAM ARRAY WITH GRIDDED SENSE AMPLIFIER POWER SOURCE FOR ENHANCED COLUMN REPAIR

This application is a continuation of application Ser. No. 09/205,188 filed on Dec. 4, 1998 (now U.S. Pat. No. 6,111,797), which is hereby incorporated herein in its entirety by reference.

BACKGROUND OF THE INVENTION

1. Field of the Invention

This invention relates to semiconductor memory devices and, in particular, to dynamic random access memory (DRAM) devices with a gridded sense amplifier power source for enhanced column repair.

2. Description of the Related Art

Integrated circuits contain a number of active semiconductor devices formed on a chip ("die") of silicon and these devices are interconnected to package leads to form a complete circuit.

An essential semiconductor device is the semiconductor memory, such as random access memories (RAM), which generally are constructed with an array of individual memory cells on a cell plate. A RAM allows the user to execute both read and write operations on its memory cells. Dynamic random access memory (DRAM) is a specific category of RAM containing an array of individual memory cells, where each includes a capacitor for holding a charge and a transistor for accessing the charge held in the capacitor.

FIG. 1 shows an exemplary DRAM cell array 5. The array 5 includes word lines 18 and bit lines 10 which are commonly arranged in rows and columns, respectively. Each individual memory cell 20 is capable of storing one data bit and is composed of a voltage source line 24, capacitor 26, and transistor 28 and is accessed by activating an associated word and bit line. The transistor 28 may be either a pMOS or nMOS transistor and the choice of either will determine the voltage carried by the word line 18. The charge held in capacitor 26 is representative of a data bit of either a logical "1" or logical "0," symbolizing a high or low voltage, respectively. The data may be accessed during a read operation or stored during a write operation.

Data is read from the memory cell 20 by firing a word line driver 32 to activate a word line 18, which couples all of the memory cells corresponding to that word line 18 or row to respective bit lines 10 which define the columns of the array 5. One or more bit lines are also activated. When a particular word line 18 and bit lines 10 are activated, a sense amplifier 80 connected to a bit line column (defined by a pair of bit lines 10) detects and amplifies the data bit transferred from the capacitor 26 to a bit line 10 by measuring the potential difference between the activated bit line 10 and a reference line which may be an inactive bit line 10. The operation of DRAM sense amplifiers is described, for example, in U.S. Pat. Nos. 5,627,785; 5,280,205; and 5,042,011, all assigned to Micron Technology Inc. and incorporated by reference herein.

For a read/write operation to be successful, there must be no defects along a row or column. A common defect is a short 30 between a bit line 10 and a word line 18. The presence of a short 30 prohibits the charge held in the capacitor 26 from being reliably sensed. This is an increasingly common problem in the construction of DRAM devices because of the rapid advancement in increasing the density of cell arrays. This rise in the number of cells per chip, or stated otherwise, the decrease in cell size and other geometries, increases the probability that a defect will be present. Another common defect is the existence of a short 40 between a bit line 10 and the cell plate, a sheet in the array that acts as one of the plates of the storage node capacitors 26. Various methods have been devised to test memory cell arrays to determine which memory cells are defective.

Today, instead of destroying a DRAM containing a number of defects, methods have been devised to repair the defective portions of the memory array and allow the repaired DRAM to be used. One of the most common methods of repairing defective arrays is by the creation and use of rows and columns of redundant memory cells. The majority of DRAMs contain some type of mechanism for the replacement of defective cells with redundant cells, a process known as "repairing out." Typically, this process uses a combination of fuses and addressing circuitry to remove the defective cells from use and redirect addressing signals to a redundant row or column which, in turn, accesses a redundant cell. Frequently, a grouping of cells along a word and/or bit line are substituted as a group due to the adverse effect that one defective cell has on the remaining cells along their common word line.

While this type of repair allows the DRAM to be operational, it does not remove the defective memory cells from the chip surface, the process merely redirects signals around the defective cells. The repaired-out cells may still adversely effect the performance of a DRAM in terms of both speed and reliability and in the sensing robustness of the remaining cells.

Shown in FIG. 1 is a bit line 10 to cell plate short 40. The existence of cell plate short 40 may lead to corruption of the sensing of other bit lines 10 on the die even after it has been detected and repaired out. When a sense amp 80 for a bit line pair is still operational and commences firing it will pull one bit line 10 to Vcc and the other to Vss when a row in that array is accessed. The cell plate is normally being driven to Vcc/2 by the bias voltage generator during the activation of sense amp 80. Because of the short, the cell plate is pulled to the voltage held by the bit line 10, either Vcc or Vss. In the case wherein the cell plate has been driven to Vss, a charge written back into the open word line 18 may also be driven to Vss. When the sense amps are then turned off, the cell plate returns to Vcc/$_2$, and the charge storage node 26 couples to Vcc/$_2$ because of the short through the bit line 10. On the next cycle when the memory cell 28 is read, the voltage of the cell 28 is at Vcc/$_2$, which is indistinguishable as either a logical "1" or "0".

The existence of a short 30 between word line 18 and bit line 10, as shown in FIG. 1, may lead to sensing problems in the array even if short 30 has been repaired out. This can be demonstrated by the effect this has on the typical circuitry of a DRAM column 100, shown in FIG. 2. FIG. 2 shows a schematic view of a column line pair 101 framed by bit lines 102 and 104. Equilibration gating lines (EQ) 108, 132 and nMOS transistors 106, 134 effectively equalize the charges held by bit lines 102 and 104 after a read/write operation is completed and when that array is not active. Frequently, the column circuitry 100 is combined with a bias voltage generator (not shown) to maintain the voltages across the bit lines 102, 104 at a voltage, commonly Vcc/2 (also known as DVC2), where Vcc is the voltage supplied to the chip containing the DRAM. The bias voltage generator will also maintain the cell plate charge at Vcc/2 as well. Other components of column circuitry 100 include isolation gating lines (ISO) 110, 126 and nMOS transistors 112, 114 and 128, 130 forming isolation devices to effectively remove certain sensors during addressing. The actual sensing and amplification is performed by the n-sense amplifier 80 controlled by the n-sense amplifier latching signal (NLAT) 116, and the p-sense amplifier 120 controlled by the p-sense amplifier latching signal (PLAT) 122, which work in conjunction to effectively read a data bit which was stored in a memory cell 20 before being transferred to bit line 102.

Since a short 30 between a word line and bit line can not be physically removed from the cell array, the short is still in existence and can result in unacceptably high standby current even though a redundant row or column of cells is substituted to remove faulty cells. This is because the equilibrated bit lines 102, 104 are connected to a bias voltage generator biasing the bit lines 102, 104 to Vcc/2 and a word line (not shown) is biased at a voltage Vss (preferably ground). Therefore, the word line will drive both the bit lines and the bias voltage generator toward ground. If the bias voltage generator cannot overcome this drain, its current production may fall outside acceptable limits and the bit lines themselves may be driven to Vss. Either of these results would produce faulty read operations if the column had not been repaired out. Yet, even if a column has been repaired out, the current leak from the bias voltage generator to the word line driver would continue to exist.

Another related problem arises when the cell plate is biased by the same bias voltage generator used to bias the bit lines. The voltage drop in the generator may result in a voltage drop in the cell plate itself which can cause corruption of the dielectric layer.

Bit line latching and leakage due to bit line/word line shorts directly effect the speed and reliability of modern DRAMs. Cell plate to word line shorts have similar detrimental effects. Although repairing out defective cells can be effective in removing some of the problems associated with bit line/word line and cell plate/word line shorts, there still remains a physical defect on the chip itself which must be addressed. Accordingly, there is a need and desire for a DRAM to be able to prevent the problems attributable to physical shorts between word and bit lines and between bit lines and the cell plate.

SUMMARY OF THE INVENTION

The present invention provides a DRAM that is able to prevent the problems attributable to shorts between bit lines and the cell plate and between word and bit lines when cells are repaired out.

The above and other features and advantages of the invention are achieved by providing an apparatus for the supply of power to an array of sense amplifiers contained within a DRAM. When the column sensed is operating normally the power source supplies a first voltage to the sense amplifiers so that they properly latch the state of an addressed memory cell. When a column has been repaired out the apparatus is capable of driving the sense amplifiers with a second voltage so that they are prevented from latching the state of an addressed memory cell, thus avoiding the problems attributable to short circuits between bit and word lines and between bit lines and cell plate of a memory cell array.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. Wherever possible, like numerals are used to refer to like elements and functions between the different embodiments of the present invention.

Figure 1:
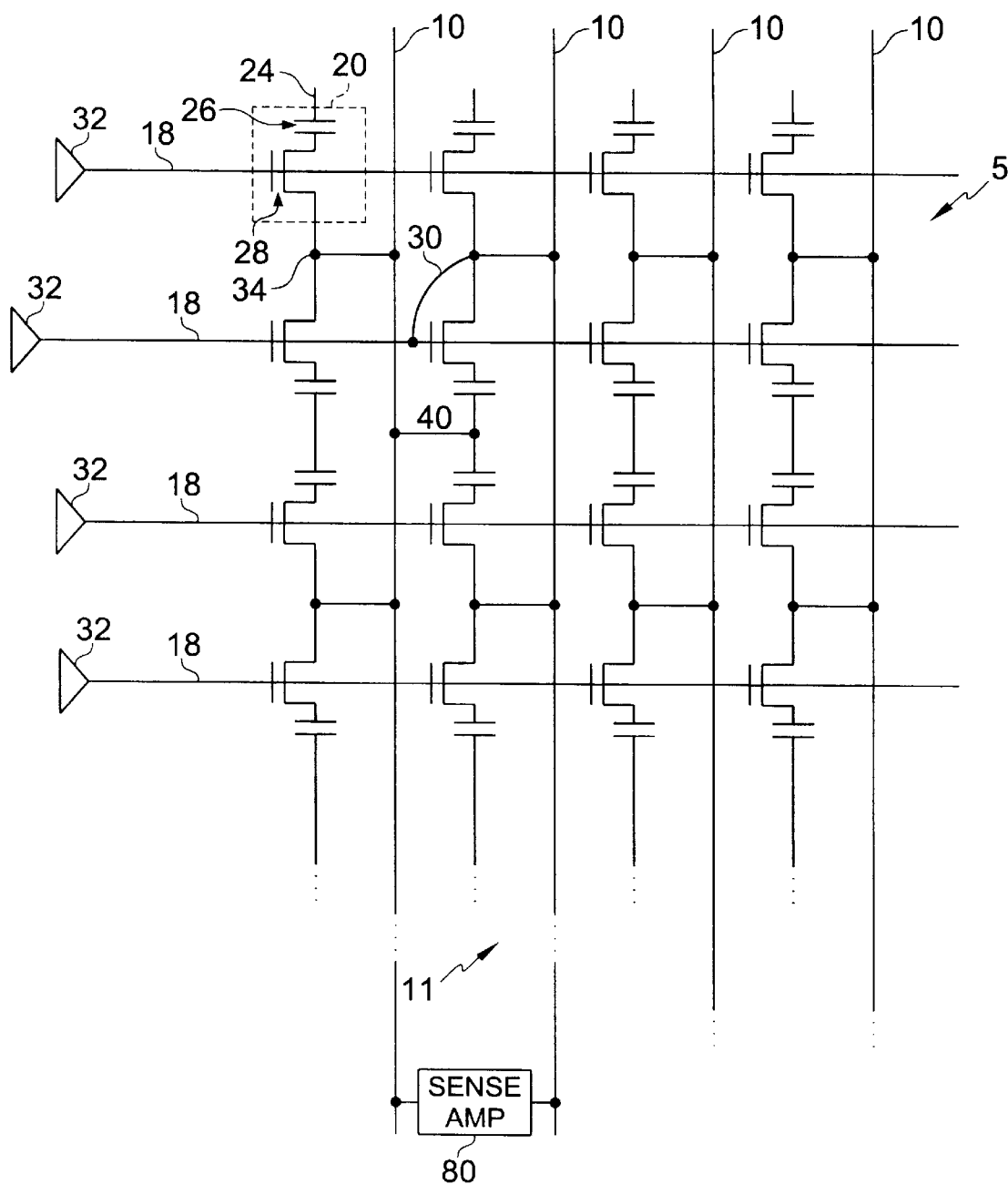
FIG. 1 is a circuit schematic representative of a Dynamic Random Access Memory (RAM)
Figure 2:
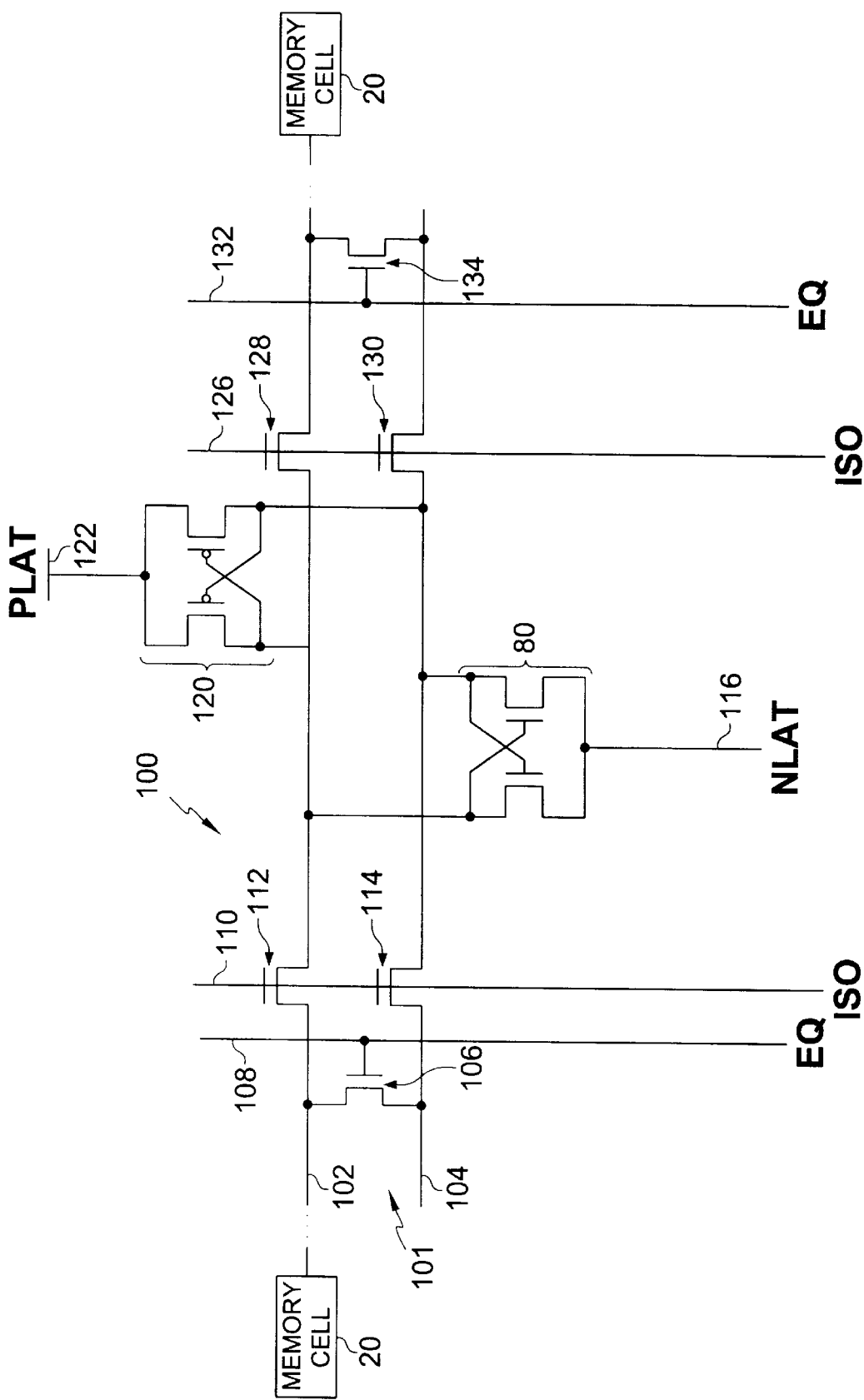
FIG. 2 is a circuit schematic of a DRAM column.
Figure 3:
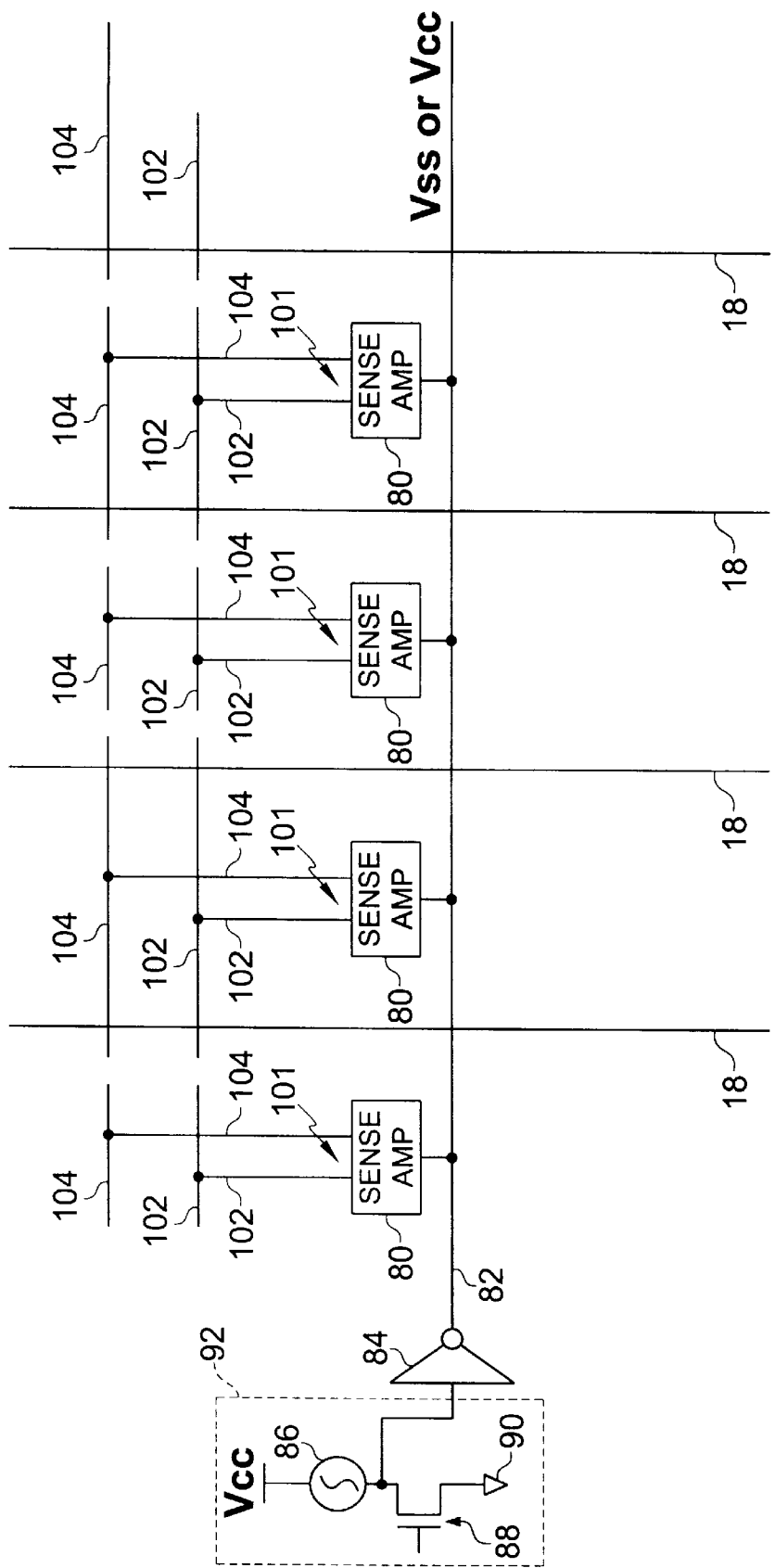
FIG. 3 is a schematic of a column array of a DRAM constructed in accordance with a preferred embodiment of the invention.

FIG. 3 illustrates a portion of a DRAM memory array constructed in accordance with the present invention. The array includes of a plurality of bit line columns 101 (defined by the bit lines 102, 104) which connect to n-sense amplifier circuits 80, a plurality of word lines 18 (it must be noted that there would be numerous word lines 18 within the array and that only a few word lines 18 are illustrated for convenience purposes), a metallic source line 82, an inverter 84, and a power source circuit 92. The circuit 92 may be either a low current circuit or pulsed fuse latch circuit. A representative pulsed fuse latch circuit is shown in FIG. 3 by a fuse 86 connected between Vcc and an nMOS transistor 88. It must be noted that the exact configuration of the power source circuit 92 may vary and the invention is not to be limited to the specific circuit 92 illustrated in FIG. 3. For example, the fuse 86 may be a laser fuse having a blown state creating an open circuit or an unblown state completing a circuit connection or an anti-fuse having a unblown state creating an open circuit or a blown state completing a circuit connection. The individual sense amplifier circuits 80 and their respective bit lines 102, 104 represent a slice of columns 101. This sense amplifier/bit line structure is repeated throughout the entire array of a DRAM.

During normal operation, the inverter 84 and the power source circuit 92 provide a Vss voltage (preferably a ground voltage) to the n-sense amplifier circuits 80 over the metallic source line 82. If a short occurs within a column it is repaired out by redirection of the addressing signal to a row or column of redundant cells. To reduce the effect of the short on the DRAM's operation, the fuse 86 of power source circuit 92 is blown so that voltage source 90 provides a voltage Vcc to the n-sense amplifier circuits 80 over metallic source line 82. This effectively deactivates n-sense amplifier circuits 80.

Figure 4:
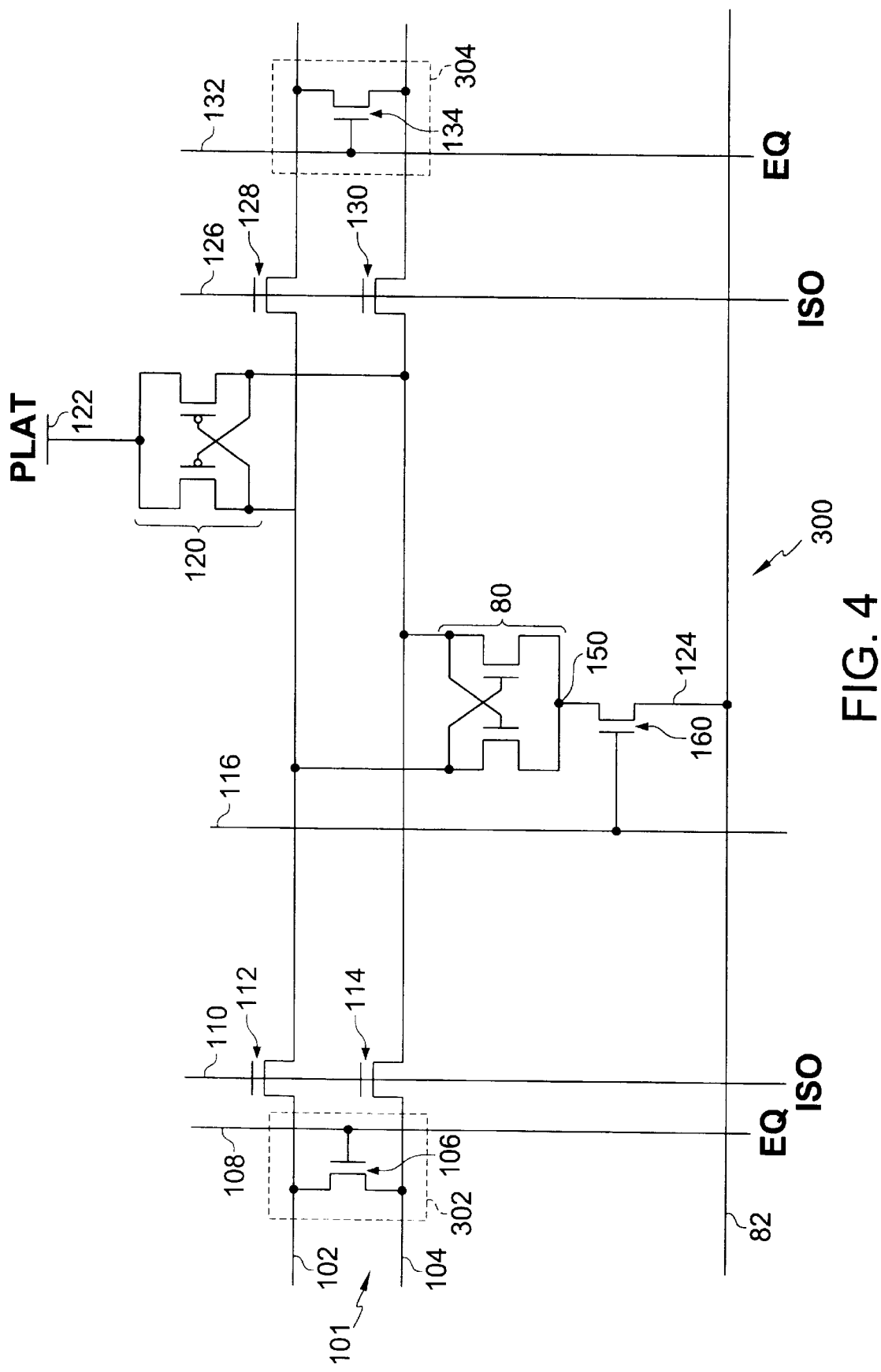
FIG. 4 is a schematic of a preferred embodiment of the present invention as applied to an n-sense amplifier implemented into a DRAM column.

FIG. 4 shows an embodiment of the present invention as applied to an individual n-sense amplifier 80 connected to a bit line column 101 defined by bit lines 102, 104. During normal operation, the n-sense amplifier 80 is brought to a ground voltage Vss upon the firing of the word line (not shown) by firing the n-sense amplifier latch firing line (NLAT) 116 to nMOS transistor 134 to allow the node 150 to be driven to Vss by the voltage on the metallic source line 82 (by the circuit 92 of FIG. 3) through conductor 124.

In the event that a defect was detected during testing and the column 101 containing the n-sense amplifier 80 has been repaired out, the fuse 86, as shown in FIG. 3, is blown causing the metallic source line 82 to be driven to Vcc by the inverter 84. Referring again to FIG. 4, upon the firing of the NLAT firing line 116 and the activation of the nMOS transistor 160, the node 150 will now be driven to Vcc preventing the sense amplifier 80 from latching the state of the bit lines 102, 104 and thus preventing problems such as faulty reads.

FIG. 4 also shows an exemplary sensing circuit 300 for one column 101 delineated by bit lines 102 and 104 constructed in accordance with the present invention. The bit lines 102, 104 are connected to transistors 106, 112, 114, 128, 130 134 which allow the circuit to isolate and amplify the voltage fluctuation corresponding to a data bit on bit line 102 (as described below). In this example bit line 104 carries the reference data. To maintain equivalent voltage levels on the bit lines 102 and 104 prior to read/write operations, the sensing circuit 300 employs a pair of equilibration sub-circuits 302, 304 respectively including an nMOS transistor 106 coupled to equilibration firing line 108 and nMOS transistor 134 coupled to equilibration firing line 132. Before a word line is fired to release a data bit, the bit lines are equilibrated to a common voltage, which for illustrative purposes is Vcc/2. The two pairs of input/output nMOS transistors 112, 114 and 128, 130 as gated by isolation firing lines (ISO) 110 and 132, respectively. The isolation devices prevent current from traveling along the bit lines unless the isolation firing lines 110, 132 have been activated. The sensing operation occurs through the connection of the n-sense amplifier 80, p-sense amplifier 120 and bit lines 102, 104 (as described above).

Figure 5:
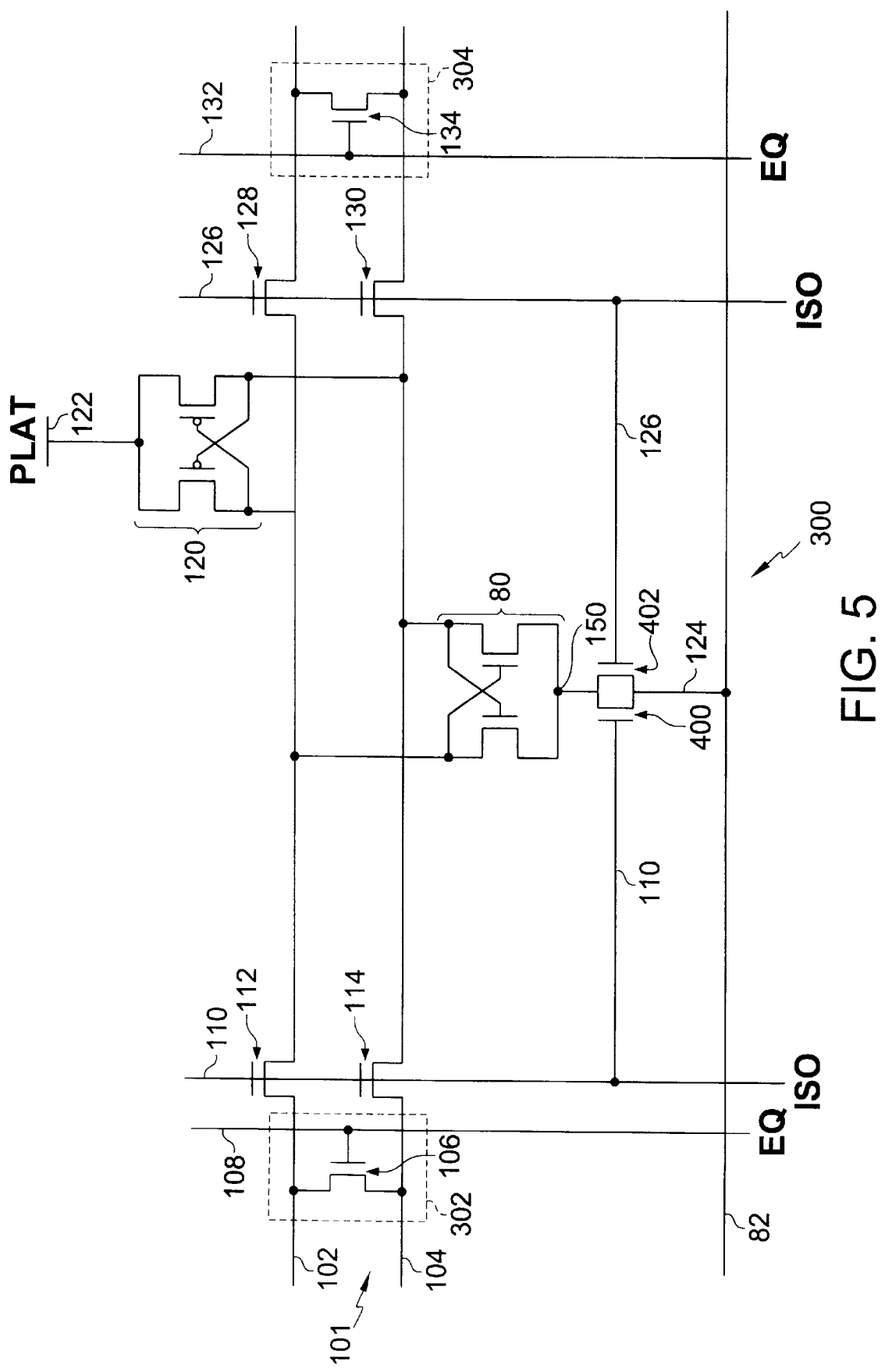
FIG. 5 is another schematic of a preferred embodiment of the present invention as applied to an n-sense amplifier implemented into a DRAM column.

Minimizing the number of components necessary for a given operation on a die is important to reduce the complexity of the manufacturing process and increase the speed at which the chip operates. To reduce the number of control lines in the present invention, NLAT firing line 116 may be replaced by ISO firing lines 110 and 126 as shown in FIG. 5. The firing of the ISO firing lines 110 and 126 would, as previously described, gate nMOS transistors 112, 114, 128, and 130 to selectively to provide bit line access to sense amplifier 80. In addition, the ISO firing lines 110 and 126 would also gate nMOS transistors 400 and 402, respectively. Therefore, firing of either ISO firing line 110 or 126 would result in passing the voltage held by conductor 124 to sense amplifier 80. If this voltage is at Vcc due to fuse 86 being previously blown because the column has been repaired out, sense amplifier 80 will be prevented from latching the bit lines 102, 104.

Figure 6:
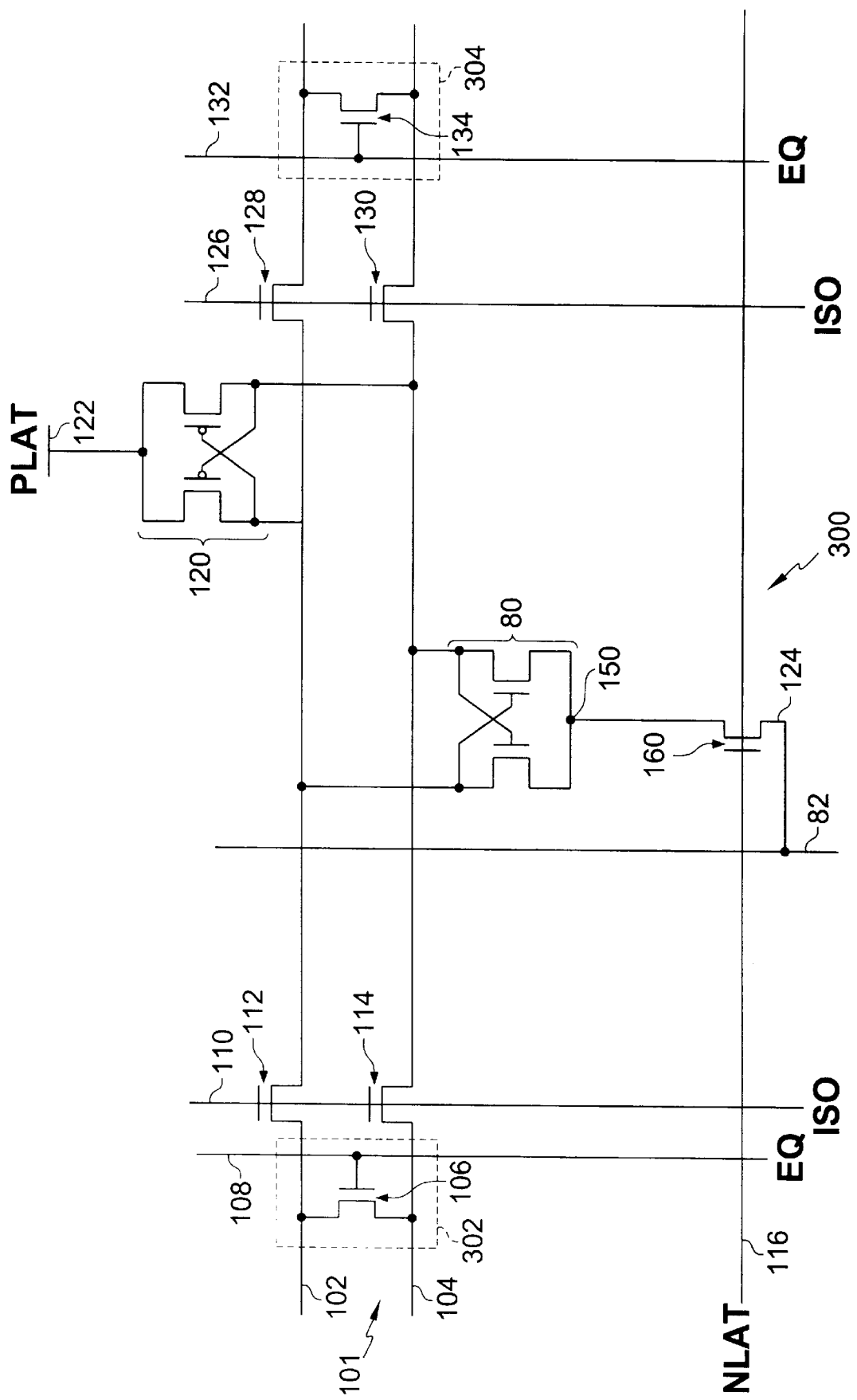
FIG. 6 is another schematic of a preferred embodiment of the present invention as applied to an n-sense amplifier implemented into a DRAM column.

Similarly, another embodiment of the present invention places the NLAT firing line 116 parallel to bit lines 102 and 104 as shown in FIG. 6. This design would allow conductor 82 to run perpendicular to bit lines 102 and 104. Conductor 82 must be capable of carrying a higher voltage than NLAT firing line 116 because it is a power source line and, therefore, must be thicker than NLAT firing line 116. A difference in required conductor width can present routing problems. This alternate configuration may be used depending upon the availability of space for conductor 82 and NLAT firing line 116 on the die.

Figure 7:
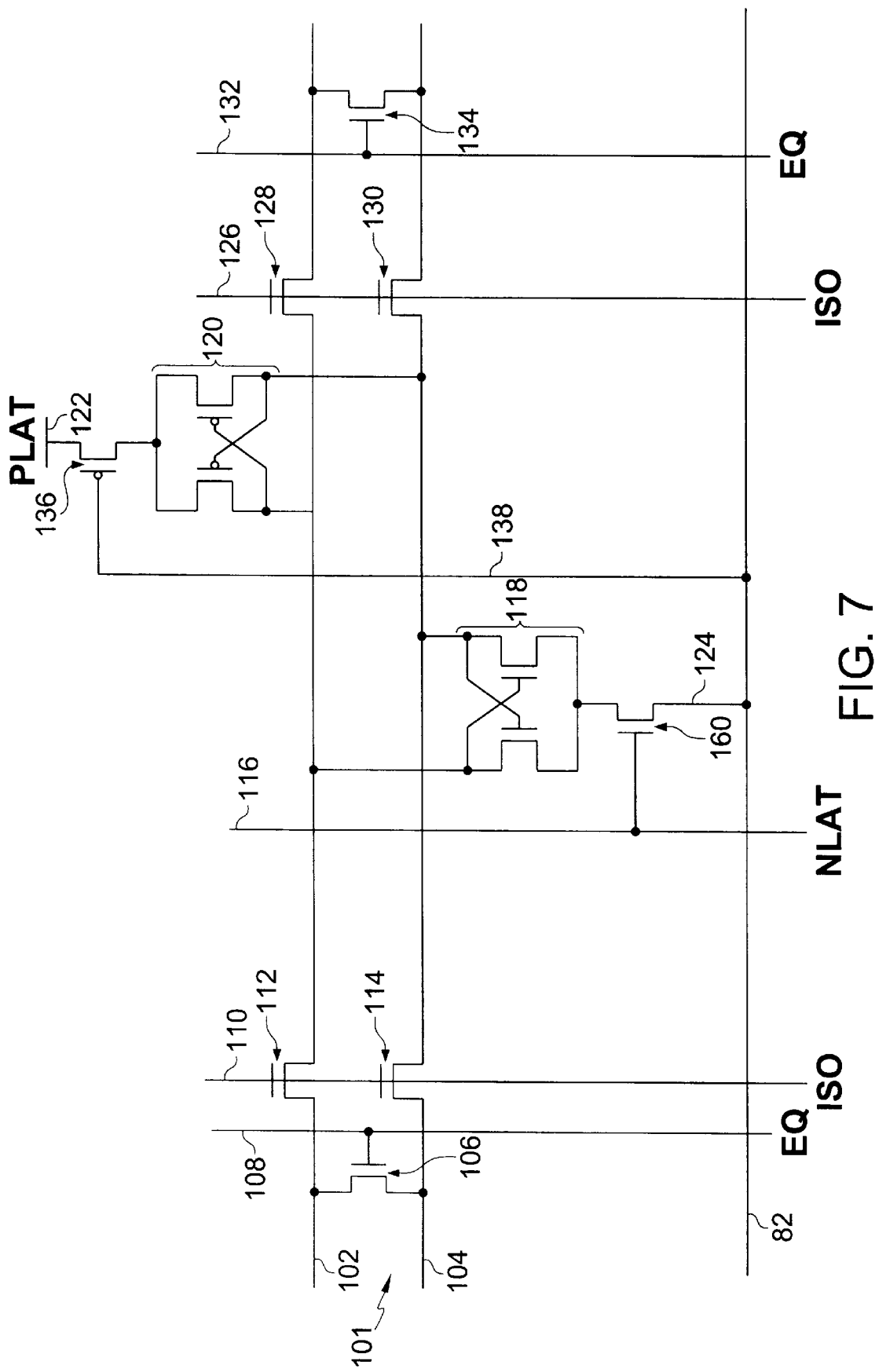
FIG. 7 is a schematic of a preferred embodiment of the present invention as applied to an p-sense amplifier implemented into a DRAM column.

A further enhancement to the present invention is to use the same metallic source line 82 (driven by the circuit illustrated in FIG. 3) to prevent the p-sense amplifier 120 shown in FIG. 7 from latching the bit lines 102, 104. The p-sense amplifier 120 is gated from PLAT signal line 122 by pMOS transistor 136 which is triggered by metallic source line 138.

During normal operation, conductor 138, through metallic source line 82, is driven to Vss which allows pMOS transistor 136 to conduct and drive node 152 to Vcc, the voltage held by PLAT signal line 122. When the column 101 (defined by the bit lines 102, 104) containing p-sense amplifier 120 has been repaired out, conductor 138 is driven to Vcc which turns off the pMOS transistor 136 connected to the PLAT signal line 122. This keeps the p-sense amplifier 120 from latching the bit lines 102, 104 at Vcc.

Figure 8:
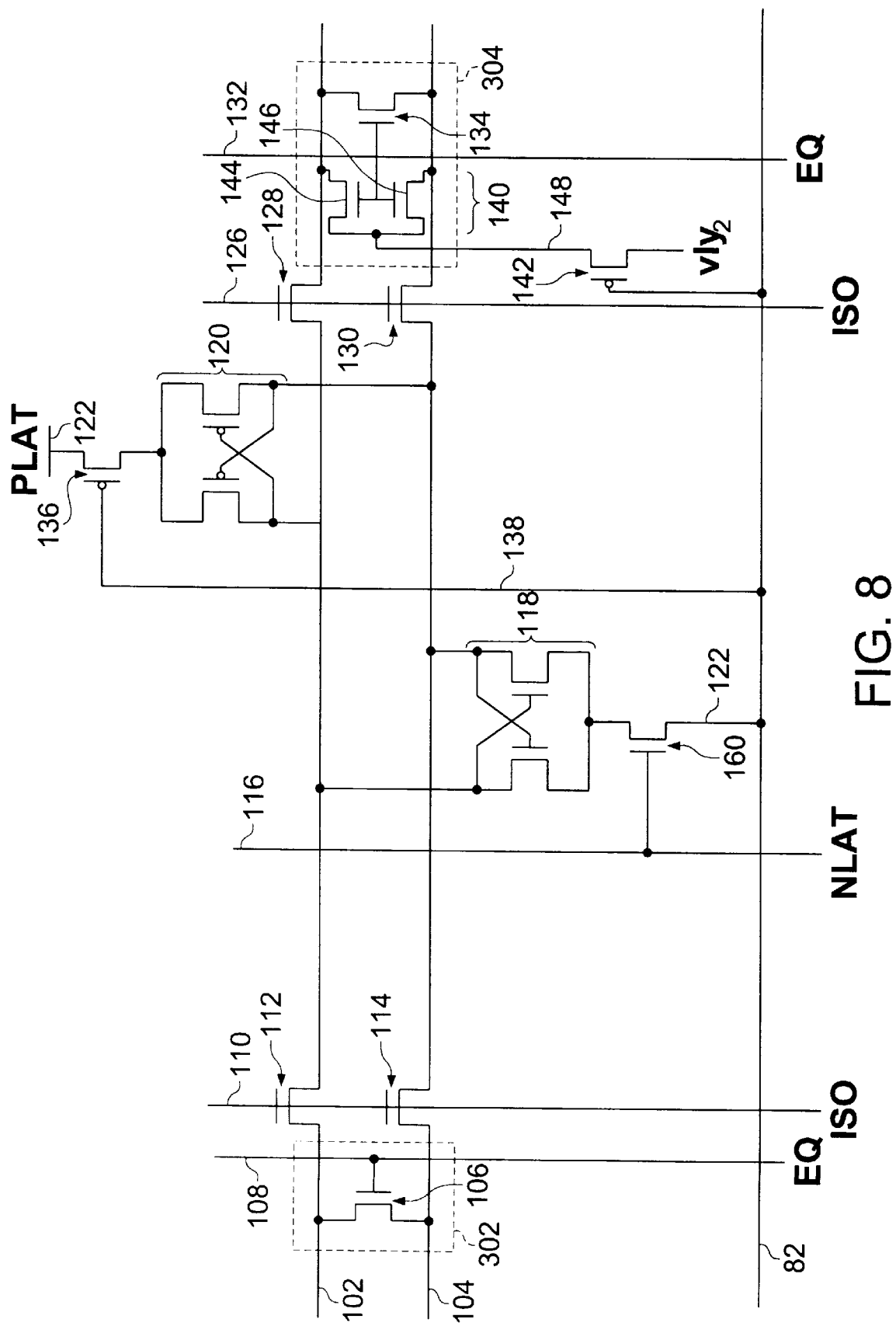
FIG. 8 is a schematic of a p-channel bleeder device as applied to an equilibrium circuit of a DRAM column.

Cross fail current, the leakage of current between shorted word and bit lines, is another recurring problem in shorted cells and is often referred to as cross fail Isb faults. FIG. 8 shows a further enhancement to the present invention, that is, the addition of a p-channel bleeder device 140 to the equilibrium sub-circuit 304 to prevent current from leaking to the word line drivers through a cell short. To ensure that the bit lines 102, 104 remain at a voltage suitable for the sensing operation performed by the sense amplifiers 80, 120, the bit lines 102, 104 are connected to a voltage source supplying Vcc/2 which is controlled by the EQ line 132. In the case of a short between a bit line 102 or 104 and a word line (not shown), the bias voltage source line 148 would be directly connected to a word line driver (not shown) which significantly increases the standby current of the bit lines 102, 104. To prevent this problem, the present invention incorporates a gate 142 by which the repaired out column would be effectively disconnected from the bias voltage source line 148. In one embodiment, a pMOS transistor is used as the gate 142 in the bias voltage source line 148 and is activated by the metallic source line 82 (driven by the circuit of FIG. 3). When a column has been repaired out, the metallic source line 82 is driven to Vcc which turns off pMOS transistor 142 to effectively disconnect the bias voltage source line 148 from the equilibrium sub-circuit 304 and prohibiting the sub-circuit 304 from biasing the bit lines 102, 104 to Vcc/2.

In operation, once the read/write operation is finished, the EQ line 132 is fired, triggering the nMOS transistors 144, 146 of the bleeder device 140. Normally, this would allow the bit lines 102, 104 to be biased to Vcc/2 for the up-coming sensing operation. When the column 101 is repaired out, however, the p-channel bleeder device 140 prohibits the biasing of the bit lines 102, 104 which prevents the leakage of current between shorted word and bit lines.

The p-channel bleeder device 140 described is one example of a current limiter that will accomplish the desired result of preventing cross fail fault leakage. Other bleeder devices 140 may include a laser fuse circuit, a long L nMOS transistor or depletion nMOS diode spliced in the bias voltage source line 148.

Figure 9:
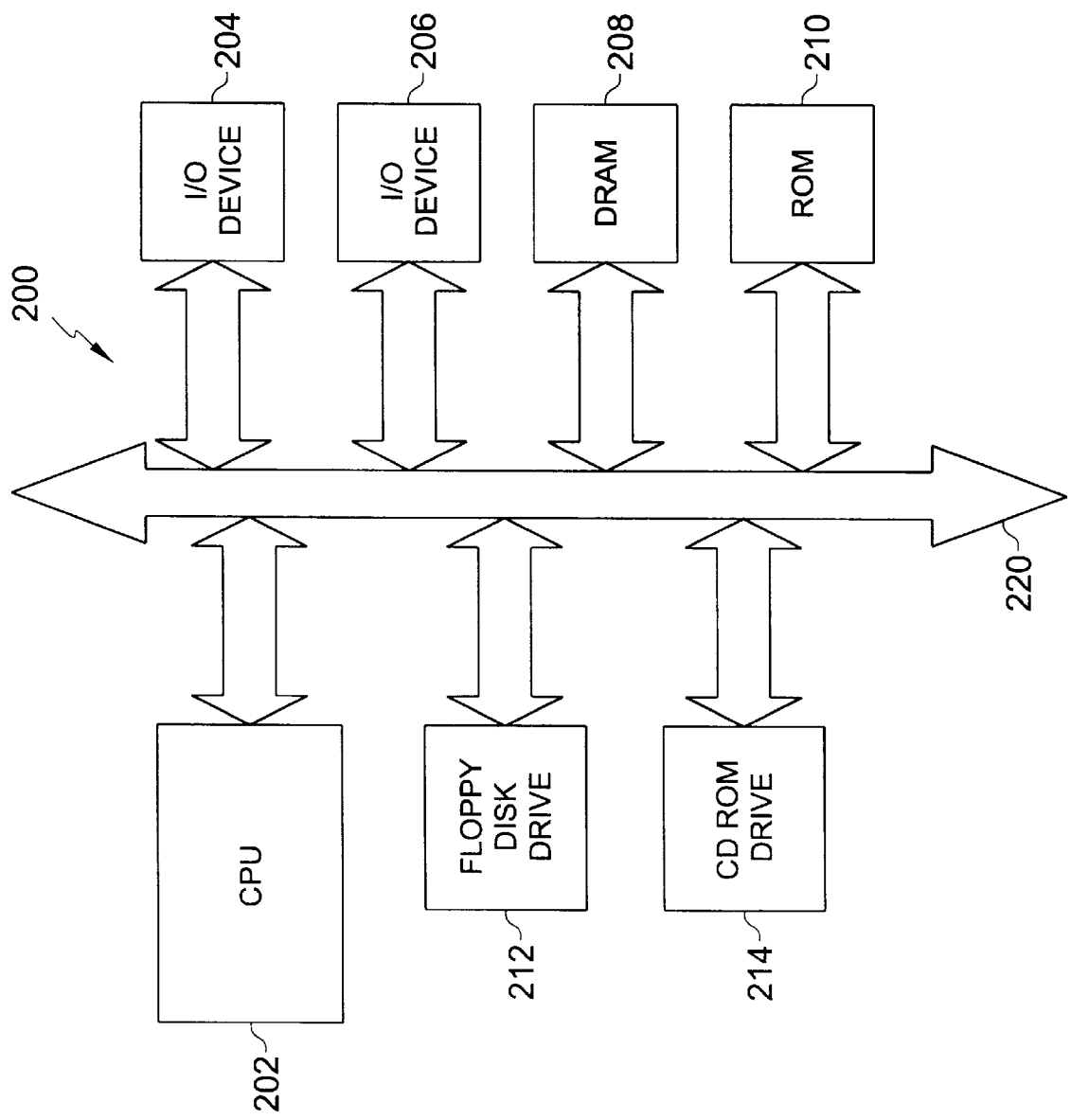
FIG. 9 illustrates a computer system utilizing a DRAM constructed in accordance with the present invention.

FIG. 9 illustrates a processor-based system 200 including a DRAM 208 constructed in accordance with the present invention. The DRAM 208 is constructed and operates as described above with reference to FIGS. 3–8. The processor-based system 200 may be a computer system, a process control system or any other system employing a processor and associated memory. The processor-based system includes a central processing unit (CPU) 202, e.g., a microprocessor, that communicates with the DRAM 208 and an I/O device 204 over a bus 220. A second I/O device 206 is illustrated, but is not necessary to practice the invention. The processor-based system 200 also includes read only memory (ROM) 210 and may include peripheral devices such as a floppy disk drive 212 and a compact disk (CD) drive 214 that also communicate with the CPU 202 over the bus 220 as is well known in the art.

It should again be noted that although the invention has been described with specific reference to DRAM circuits, the invention has broader applicability and may be used in many memory sensing applications. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of correcting for a short circuit in a memory device, said method comprising:
   providing a sense amplifier circuit connected to a column of the memory device for latching a logic state of an addressed memory cell;
   providing a switchable voltage source circuit having a first output;
   providing a first conductor line connected between said first output and said sense amplifier circuit; and
   selectively switching said voltage source circuit between a first voltage and a second voltage, wherein said first voltage is selected when said column is operational and said second voltage is selected when said column has been repaired out,
   wherein when said first voltage is selected, said first voltage is applied to said sense amplifier circuit and causes said sense amplifier circuit to properly latch said logic state of said addressed memory cell through said column, and wherein when said second voltage is selected, said second voltage is applied to said sense amplifier circuit and prevents said sense amplifier circuit from latching said logic state of said addressed memory cell through said column.

2. The method of claim 1 further comprising providing a latching circuit in said voltage source circuit.

3. The method of claim 2 further comprising providing a pulsed fuse latch circuit in said latching circuit.

4. The method of claim 3 wherein said selective switching is performed using a fuse having a first and second state, wherein said first voltage is used as said first output when said fuse is in said first state and said second voltage is used as said first output when said fuse is in said second state.

5. The method of claim 4 further comprising providing as said fuse a laser fuse.

6. The method of claim 2 wherein said selective switching is performed using an anti-fuse having a first and second state, wherein said first voltage is used as said first output when said anti-fuse is in said first state and said second voltage is used as said first output when said anti-fuse is in said second state.

7. The method of claim 1 further comprising generating a second output responsive to said first output and applying said second output over said first conductor line.

8. The method of claim 7 wherein said act of generating said second output includes connecting a logic element between said first output and said first conductor line.

9. The method of claim 8 further comprising providing an inverter as said logic element.

10. The method of claim 1 further comprising selectively connecting said first output to said sense amplifier circuit using a first transistor connected between said first output and said sense amplifier circuit, wherein said first transistor is controlled by a first control signal carried by a second conductor line.

11. The method of claim 10 further comprising providing an n-sense amplifier circuit in said sense amplifier circuit.

12. The method of claim 10 further comprising providing said second conductor line in substantially perpendicular relationship to said column and said first conductor line in substantially parallel relationship to said column.

13. The method of claim 10 further comprising providing said second conductor line in substantially parallel relationship to said column and said first conductor line in substantially perpendicular relationship to said column.

14. The method of claim 10 further comprising selectively connecting a voltage source to at least a second sense amplifier circuit for latching said logic state of said addressed memory cell, said act of selectively connecting being performed using a second transistor connected between said second sense amplifier and said voltage source, wherein said second transistor is controlled by said first output.

15. The method of claim 14 further comprising providing a p-sense sense amplifier circuit in said sense amplifier circuit.

16. The method of claim 10 further comprising an isolation circuit connected in series in bit lines in said column, wherein said isolation circuit comprises at least two transistors controlled by a voltage source carried by an isolation voltage conductor line.

17. The method of claim 16 wherein said isolation voltage conductor line provides said first control signal.

18. The method of claim 1 further comprising selectively equalizing a voltage level between bit lines in said column using an equilibrium circuit connected between said bit lines.

19. The method of claim 16 further comprising providing a first transistor connected between said bit lines in said equilibrium circuit, said first transistor being connected to an equilibration conductor line.

20. The method of claim 17 further comprising providing a second, third, and fourth transistor in said equilibrium circuit, said second and third transistors being connected between said bit lines and said fourth transistor being located between said bit lines and a bias voltage source, wherein said second and third transistors are controlled by said equilibration conductor line and said fourth transistor is controlled by said first output via said first conductor line.

* * * * *

UNITED STATES PATENT AND TRADEMARK OFFICE
CERTIFICATE OF CORRECTION

PATENT NO. : 6,205,066 B1
DATED : April 19, 2001
INVENTOR(S) : Brian Shirley

It is certified that error appears in the above-identified patent and that said Letters Patent is hereby corrected as shown below:

Claim 19,
Line 1 (col. 8, line 53), the number "16" should be replaced with the number -- 18 --.

Claim 20,
Line 1 (col. 8, line 57), the number "17" should be replaced with the number -- 19 --.

Signed and Sealed this

Sixth Day of November, 2001

Attest:

NICHOLAS P. GODICI
Attesting Officer     Acting Director of the United States Patent and Trademark Office